US010090663B2

(12) United States Patent
Chen et al.

(10) Patent No.: US 10,090,663 B2
(45) Date of Patent: Oct. 2, 2018

(54) OVER-CURRENT PROTECTION CIRCUIT AND METHOD FOR VOLTAGE REGULATORS

(71) Applicant: SEMICONDUCTOR COMPONENTS INDUSTRIES, LLC, Phoenix, AZ (US)

(72) Inventors: Gang Chen, Tai Po (HK); Gabor Reizik, Dublin, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 342 days.

(21) Appl. No.: 15/158,377

(22) Filed: May 18, 2016

(65) Prior Publication Data

US 2017/0201086 A1    Jul. 13, 2017

Related U.S. Application Data

(60) Provisional application No. 62/277,109, filed on Jan. 11, 2016.

(51) Int. Cl.
| | | |
|---|---|---|
| *H02H 3/00* | (2006.01) | |
| *H02H 3/08* | (2006.01) | |
| *H03K 3/017* | (2006.01) | |
| *H03K 7/08* | (2006.01) | |
| *H02H 3/087* | (2006.01) | |
| *H02H 9/02* | (2006.01) | |

(52) U.S. Cl.
CPC ............. *H02H 3/08* (2013.01); *H02H 3/087* (2013.01); *H02H 9/025* (2013.01); *H03K 3/017* (2013.01); *H03K 7/08* (2013.01)

(58) Field of Classification Search
CPC ........................................................ H02H 3/08
See application file for complete search history.

(56) References Cited

U.S. PATENT DOCUMENTS

| | | | | | |
|---|---|---|---|---|---|
| 6,211,623 | B1* | 4/2001 | Wilhelm | ............ | H05B 41/2983 |
| | | | | | 315/224 |
| 6,465,993 | B1* | 10/2002 | Clarkin | ................ | H02M 3/156 |
| | | | | | 323/272 |
| 7,245,113 | B2* | 7/2007 | Chen | ................... | H02M 3/1588 |
| | | | | | 323/271 |
| 7,446,431 | B2* | 11/2008 | Chiu | ................... | H02M 3/1584 |
| | | | | | 307/52 |
| 8,358,518 | B2* | 1/2013 | Yang | .................... | H02M 3/156 |
| | | | | | 363/21.13 |

* cited by examiner

*Primary Examiner* — Stephen W Jackson
(74) *Attorney, Agent, or Firm* — Robert F. Hightower

(57) ABSTRACT

A voltage regulator includes a control circuit, a switch circuit, a first over-current protection circuit, and a second over-current protection circuit. The control circuit generates a pulse-width modulation (PWM) signal having a duty cycle proportional to an output voltage of the voltage regulator. The first over-current protection circuit blocks the PWM signal when an over-current condition exists during an off time of the PWM signal until a low-side switch current-sense level in the switch circuit drops below a set current limit level, while the second over-current protection circuit turns off the PWM signal when an over-current condition occurs during an on time of the PWM signal when a ramp adjusted voltage level added to the low-side switch current-sense level exceeds a summed level of the set current limit level and a set threshold.

19 Claims, 5 Drawing Sheets

OVER-CURRENT PROTECTION CIRCUIT AND METHOD FOR VOLTAGE REGULATORS

CROSS-REFERENCE TO RELATED APPLICATION

This application claims priority to U.S. Provisional Application No. 62/277,109, filed on Jan. 11, 2016, entitled "OVER-CURRENT PROTECTION CIRCUIT AND METHOD FOR VOLTAGE REGULATORS," invented by Gang CHEN and Gabor REIZIK, and is incorporated herein by reference and priority thereto for common subject matter is hereby claimed.

TECHNICAL FIELD

Aspects of the present disclosure relate to voltage regulators and, in particular, to an over-current protection circuit and method for voltage regulators.

BACKGROUND

Voltage regulators are commonly used for providing electrical power with a stable output voltage to a load. A particular type of voltage regulator is a switching regulator that controls an output voltage of the voltage regulator using one or more switches that are switched on and off with a duty cycle proportional to a measured output voltage of the voltage regulator. The switches typically include metal-oxide-semiconductor field-effect transistor (MOSFETs) devices that are controlled by a switching circuit, such as a pulse-width modulation (PWM) circuit, in which the pulse width is controlled to maintain constant output voltage, or a constant on-time (COT) circuit in which pulse width is kept constant while a duration between pulses, the off time, is controlled to maintain constant output voltage.

SUMMARY

According to one aspect, a voltage regulator includes a control circuit, a switch circuit, a first over-current protection circuit, and a second over-current protection circuit. The control circuit generates a PWM signal having a duty cycle proportional to the output voltage of the voltage regulator. The first over-current protection circuit blocks the PWM signal when an over-current condition exists during an off time of the PWM signal until a low-side switch current-sense level in the switch circuit drops below a set current limit level, while the second over-current protection circuit turns off the PWM signal when an over-current condition occurs during an on time of the PWM signal when a ramp adjusted voltage level added to the low-side switch current-sense level exceeds a summed level of the set current limit level and a set threshold.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters may refer to the same parts throughout the different views. The drawings depict only typical embodiments of the present disclosure and, therefore, are not to be considered limiting in scope.

DETAILED DESCRIPTION

Figure 1:
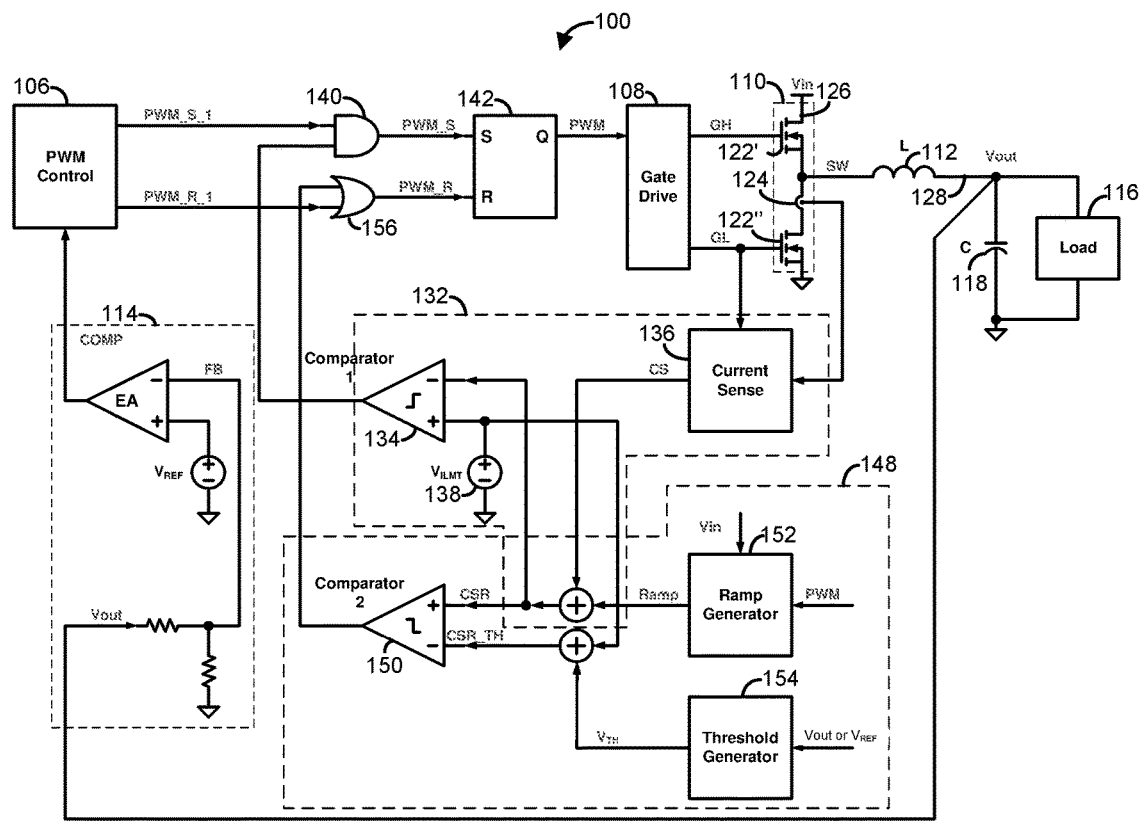
FIG. 1 illustrates an example switching voltage regulator that may be used to provide over-current protection incurred during off times of the PWM signal as well as on times of the PWM signal according to one embodiment of the present disclosure.

Aspects of an adaptive over-current protection topology described herein provide a circuit and method of operation for limiting over-current conditions in switching voltage regulators. The circuit topology uses a low-side switch current sense in a switching circuit and two protection circuits to limit over-current conditions during both the off times and on times of the switching signal applied to the switching circuit. In particular, over-current conditions exhibited during the on times of the switching signal may be controlled using a summed signal with an adaptive ramp signal and a stored value of the current level exhibited during the off times of the switching signal. The summed signal represents a load current level that exists during the on time of the switching signal that can be fed to one of the protection circuits for limiting over-current conditions during the on times of the switching signal.

A switching voltage regulator is a particular type of voltage regulator that controls an output voltage using a switching circuit that is switched on and off with a duty cycle proportional to a measured output voltage of the voltage regulator. The switching circuit may include, for example, a single switch (e.g., a transistor) that is coupled to a free-wheeling diode to shunt reverse current excited by an output inductor when the switch is turned off. The switching circuit may include multiple switches, such as a push-pull switching circuit including two switches that are alternatively turned on and off for generating a switching signal to the inductor.

Use of such switching voltage regulators may provide enhanced efficiency over non-switching regulators by reducing or limiting voltage drop across the switches in the voltage regulators. That is, a switching voltage regulator regulates its output by alternatively switching one or more switches on and off with a duty cycle sufficient to maintain regulation while keeping the switches at or near a saturated condition in either their on or off states. Nevertheless, switching voltage regulators are faced with several challenges to be overcome to ensure their proper operation. For example, transient loading conditions, such as a short circuit placed across the output of a switching voltage regulator may cause excessive current to be drawn through their switching circuits causing a permanent damage if not properly controlled or limited.

To remedy this problem, several conventional approaches for over-current limitation have been implemented. For example, one over-current protection approach has been developed that senses a high-side switch current-sense point (e.g., an input voltage (Vin)) of the switching circuit) of a push-pull switching circuit. This circuit may control over-current conditions during on times of the switching signal, but the limited current level is not very accurate due to relatively large noise typically incurs at the current-sense point when the high-side switch turns on. Additionally, over-current protection circuits that use the high-side sense point of the switching circuit may be a challenge to implement for narrow on-time applications.

Another type of conventional over-current protection approach includes one that senses a low-side switch sense point of the push-pull switching circuit. Although this conventional approach effectively controls over-current conditions during the off times of the switching signal, it is essentially incapable of controlling over-current conditions during the on times of the switching signal. An alternative approach to the over-current protection approaches described above includes an over-current protection circuit that senses both the high-side switch current-sense point and the low-side switch current-sense point of the switching circuit. Nevertheless, this type of over-current protection circuit is typically complex thus expensive to implement. Additionally, the implementation of this type of circuit may still need to overcome challenges for narrow on-time applications.

FIG. 1 illustrates an example switching voltage regulator 100 according to one embodiment of the present disclosure. The switching voltage regulator 100 is implemented with a switching voltage regulator, which in this particular case is a synchronous buck converter that converts an input voltage (Vin) to an output voltage (Vout). The switching voltage regulator includes a pulse-width modulation (PWM) circuit 106, a gate drive circuit 108, a push-pull switching circuit 110, an inductor 112, and a feedback circuit 114. The PWM circuit 106 generates a PWM signal that is fed to the push-pull switching circuit 110, via the drive circuit 108, to deliver electrical power from the input (Vin) to the output (Vout), which is coupled to a load 116 and a capacitor 118. As will be described in detail below, the switching voltage regulator 100 modifies the PWM signal sent to the switching circuit 110 so that the switching voltage regulator 100 may be protected against over-current conditions incurred during off times of the PWM signal as well as during on times of the PWM signal using a low-side switch current-sense point 124 of the push-pull switching circuit 110.

In the particular example switching voltage regulator 100, the switching circuit 110 is a push-pull switching circuit having an upper switch 122' and a lower switch 122" that selectively couples the input Vin of the circuit to the output Vout of the circuit using the PWM signal. Although the push-pull switching circuit 110 as shown and described is a push-pull switching circuit, the over-current protection circuit 100 may be implemented with other types of switching circuits, such as a switching circuit having only a single switch and a free-wheeling diode that commutates the inductor 112 current when the switch is turned off. Additionally, although the switches 122 as shown comprise metal-oxide-semiconductor field-effect transistors (MOSFETs), the switches may be any suitable types, such as bipolar transistors, junction field effect transistors (JFETs), and the like.

For push-pull switching circuits implemented with MOSFET switches, the low-side current-sense point 124 generally refers to a node of the push-pull switching circuit 110 that is proximate a drain terminal of a low-side switch 122", while a high-side sense point 126 refers to a node of the push-pull switching circuit 110 that is proximate the drain terminal of the high-side switch 122' (i.e. the Vin input). Additionally, a continuous current sense point 128 is defined as a node that interconnects the inductor 112 with the load 116.

The control circuit 106 generates a PWM signal with a duty cycle proportional to an output voltage of the voltage regulator using the feedback circuit 114. The error amplifier monitors a difference between the output voltage sense (FB) signal and a voltage reference ($V_{REF}$) signal, and accordingly provides a compensated error (COMP) signal that is used to control the operation of the PWM control circuit 106. In normal operation, PWM switching pulses are initiated by a PWM set (PWM_S_1) signal and terminated by a PWM reset (PWM_R_1) signal that are generated by the PWM control circuit 106.

It should be understood that FIG. 1 only describes one example of a switching voltage regulator and that other embodiments contemplate that the switching voltage regulator 100 may be implemented with other switching voltage regulators having additional, fewer, or other types of components than what is described herein. For example, although the switching voltage regulator as shown and described is a synchronous buck converter that reduces a voltage level between its input and output, other embodiments of the switching voltage regulator may also include other types of switching voltage regulators, such as a buck-boost converter or a Zeta converter.

A first over-current protection circuit 132 of the switching voltage regulator 100 includes a first comparator 134 that is fed by a current-sense circuit 136 and a $V_{ILMT}$ threshold voltage source 138. In general, the first over-current protection circuit 132 blocks the PWM signal, via an AND gate 140 and a PWM latch 142, when an over-current condition exists during an off time of the PWM signal according to a low-side current-sense level (CS) generated by the current-sense circuit 136. The low-side switch current-sense circuit 136 senses the inductor 112 current by measuring a voltage drop across a drain and a source terminals of the low-side switch (e.g., MOSFET) 122" during its on time (i.e., off time of the PWM signal) to generate the current-sense (CS) signal. The output signal of the first comparator 134 uses the AND gate 140 to block a first signal (PWM_S_1) from setting the PWM latch 142 if the CS signal exceeds a current limit threshold $V_{ILMT}$ signal generated by the current limit reference generator 138.

A second over-current protection circuit 148 of the switching voltage regulator 100 includes a second comparator 150, a ramp generator 152, and a threshold generator 154. The second comparator 150 is configured to turn off the PWM signal when an over-current condition exists during an on time of the PWM signal according to a ramp adjusted voltage level (CSR) signal comprising a ramp voltage summed with the low-side current-sense (CS) signal. That is, the output of the second comparator 150 uses an OR gate 156 to reset the PWM latch 142 once the sum of the CS signal and a ramp signal generated by the ramp generator 152 is higher than the second threshold (CSR_TH) signal, which is a sum of current limit threshold $V_{ILMT}$ signal and an output threshold $V_{TH}$ signal generated by the threshold generator 154.

In order to have a consistent over-current protection level and stable switching frequency over variable operation conditions, adaptive feedforward control may be used in the ramp generator 152 and the threshold generator 154. The slew rate of the ramp signal is proportional to the input supply voltage (Vin) and the nominal switching frequency (FSW) while the threshold signal ($V_{TH}$) is proportional to either the output voltage (Vout) or a reference voltage (VREF).

Figure 2:
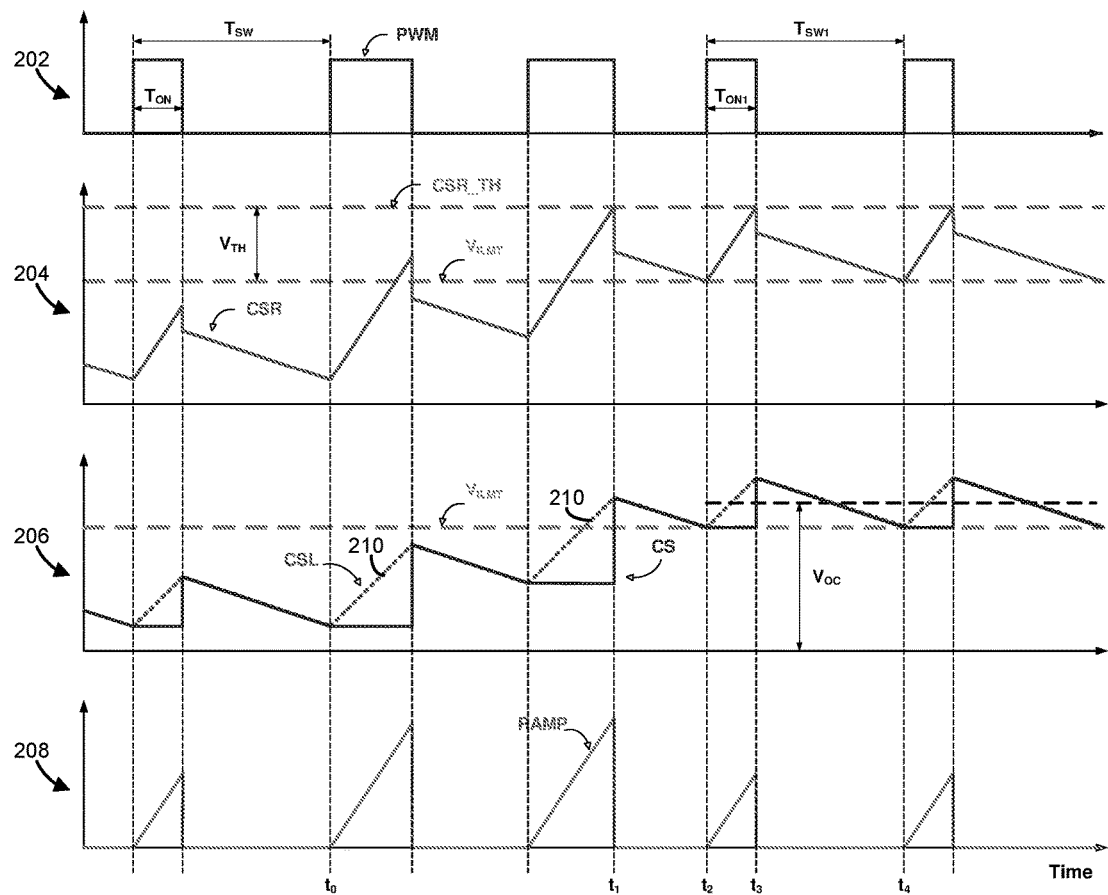
FIG. 2 illustrates example waveforms of the signals generated by various components of the over-current protection circuit of FIG. 1 according to one embodiment of the present disclosure.

FIG. 2 illustrates example waveforms of the signals generated by various components of the first over-current protection circuit 132 and the second over-current protection circuit 148 according to one embodiment of the present disclosure. In particular, waveform 202 illustrates the PWM signal generated by the PWM latch 142, waveform 204 illustrates the CSR signal created by the summed combination of the CS signal and the ramp signal, waveform 206 illustrates the CS signal generated by the current-sense circuit 136, and waveform 208 illustrates the ramp signal generated by the ramp generator 152. Additionally, a CSL waveform 210 refers to a fictive signal representing a product of the inductor current and a conduction resistance of the low-side switch 122". Generally speaking, the PWM signal has on times designated by $T_{ON}$ and $T_{ON1}$ corresponding to logic high state of the PWM signal, and has off times (e.g., logic lo) designated by those periods between the on times corresponding to the logic low state of the PWM signal.

In this example case, the current-sense circuit 136 senses and tracks a conduction voltage drop across the low-side switch 122" during the off time of PWM signal (e.g., valley portion of the PWM signal) and holds the sensed conduction voltage drop throughout the on time of PWM signal using a sample-and-hold circuit. The CSR signal is the sum of the CS signal and the ramp signal, while the CSR_TH signal is the sum of the current limit threshold ($V_{ILMT}$) signal and the threshold voltage signal ($V_{TH}$).

Before time ($t_0$), the switching voltage regulator operates in normal condition with an output current lower than a set current limit. After time ($t_0$) however, an over-current event occurs in the output load 116 such that the inductor current rises rapidly due to a long duration of on time in the PWM signal. At time ($t_1$), the CSR signal approaches the value of the CSR_TH signal, and the PWM signal is reset by the second comparator 150 via the OR gate 156. At this point, the PWM signal can only be set again at time ($t_2$) when the CS signal becomes lower than the current limit threshold signal ($V_{ILMT}$). As long as the over-current event continues, the CSR signal will operate in a window between the CSR_TH signal and the current limit threshold signal ($V_{ILMT}$) for ongoing cycles of the PWM signal. As a result, the low-pass filter current level depicted by CSL is well clamped to an average level as represented by an inductor over-current voltage signal ($V_{OC}$).

In normal operation, The PWM signal has a nominal switching period ($T_{SW}$), and generates pulses with an on time ($T_{ON}$) that may be calculated according to:

$$Ton = \frac{Tsw * Vout}{Vin}$$

A good practice would be to make the over-current mode switching period ($T_{SW1}$) during over-current protection operation to be close to the nominal switching period ($T_{SW}$). In general, switching loss increases if the over-current mode switching period ($T_{SW1}$) is much shorter than that of the nominal switching period ($T_{SW}$). In the other direction, the ripple voltage in output increases if the over-current mode switching period ($T_{SW1}$) is much longer than that of the nominal switching period ($T_{SW}$). Therefore in one embodiment, the slew rate of the ramp (Sramp) signal may be set according to:

$$Sramp = \frac{Vth}{Ton}$$

That is, the slew rate of the ramp signal may be designed to be generally equivalent to a quotient of Vth divided by Ton so that the threshold voltage signal ($V_{TH}$) may be adjusted to maintain the switching period ($T_{SW1}$) to be generally similar to the switching period ($T_{SW}$) during normal operation.

Figure 3:
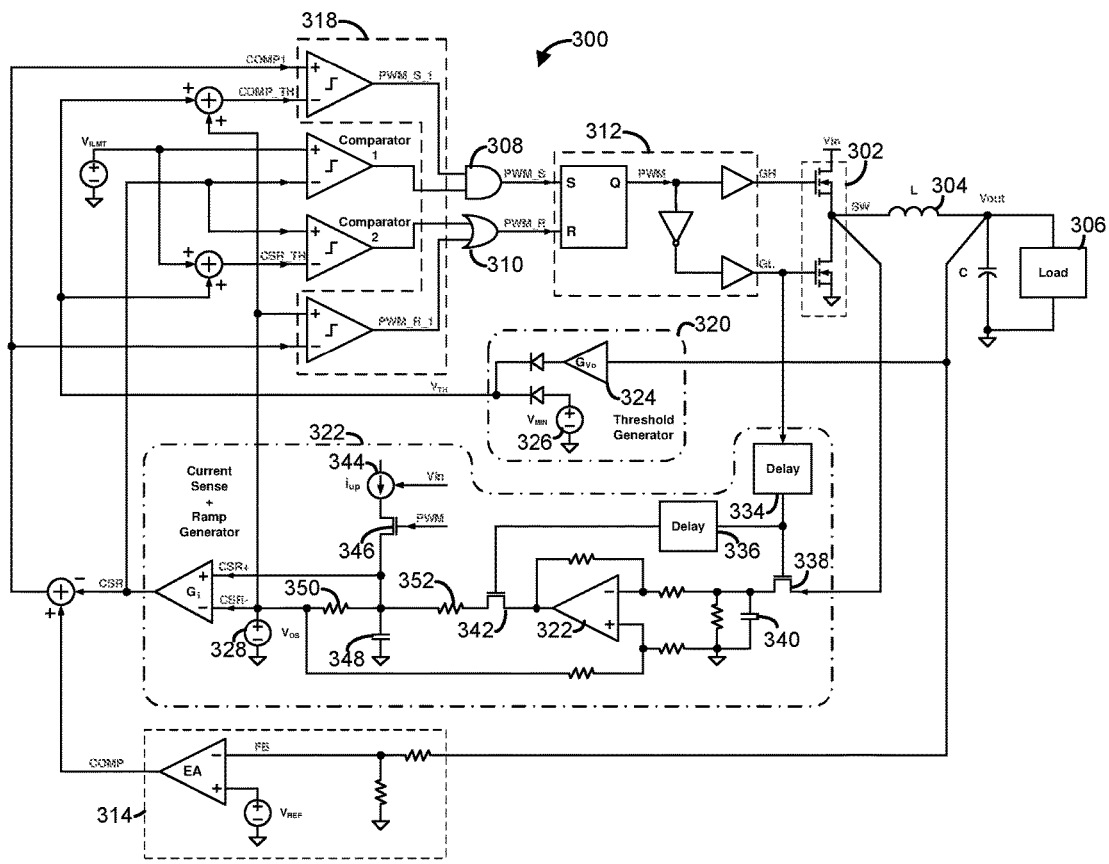
FIG. 3 illustrates another example switching voltage regulator that may utilize an over-current protection circuit according to one embodiment of the present disclosure.

FIG. 3 illustrates another example switching voltage regulator 300 that may utilize an over-current protection circuit according to the teachings of the present disclosure. The switching voltage regulator 300 generally includes a push-pull switching circuit 302, an inductor 304, a load 306, an AND gate 308, an OR gate 310, a PWM latch 312, and a feedback circuit 314 that are similar in design and construction to the push-pull switching circuit 110, inductor 112, load 116, AND gate 140, OR gate 156, PWM latch 142 and feedback circuit 114 of FIG. 1.

The switching voltage regulator 300 also includes a PWM control circuit 318 that may be controlled by a threshold generator circuit 320 and a current sense and ramp generator circuit 322 to provide over-current protection during both on times and off times of a PWM signal generated by the PWM circuit 318.

The threshold generator circuit 320 may generate a threshold signal $V_{TH}$ to be proportional to Vout by means of the gain stage amplifier ($G_{Vo}$) 324. To reduce switching frequency in low Vout conditions, the threshold signal $V_{TH}$ may have a minimum output voltage $V_{MIN}$ as determined by a minimum voltage source $V_{min}$ 326. The $V_{TH}$ signal is then summed with a signal from an offset voltage source $V_{OS}$ 328 to generate a COMP_TH signal that is fed to the PWM control circuit 318.

The current sense and ramp generator circuit 322 may be used to provide over-current protection during on times and off times of the PWM signal. The current sense and ramp generator circuit 322 includes a sample-and-hold circuit having an operational amplifier (op-amp) 332, a first delay circuit 334, and a second 336 delay circuit. The sample-and-hold circuit tracks and holds a conduction voltage of the low-side switch of the switching circuit 302 during its on time. The delay time in the sample-and-hold circuit may also add a blanking time to prevent noise injection. When the PWM signal is off, the first delay circuit 334 gates a first switch 338 to charge a capacitor 340, while the second delay circuit 336 gates a second switch 342 to apply the sensed CS signal level to a ramp generator during the on time of the PWM signal.

The ramp generator has an adaptive current source ($i_{up}$) 344, a switch 346, and a capacitor 348. As shown, the slew rate of the ramp signal generated by the ramp generator is proportional to the Vin level and is gated to the capacitor 348 by the switch 346 during the on time of the PWM signal. That is, the current source 344 is controlled by the Vin signal to obtain adaptive pulse-width control of PWM signal. The CSR signal is a combination of the ramp signal and the stored CS signal from the sense circuit. The capacitor 348 and resistors 350 and 352 form a summing circuit to sum the ramp signal to the CS signal from the sample-and-hold circuit with appropriate time constant.

Figure 4:
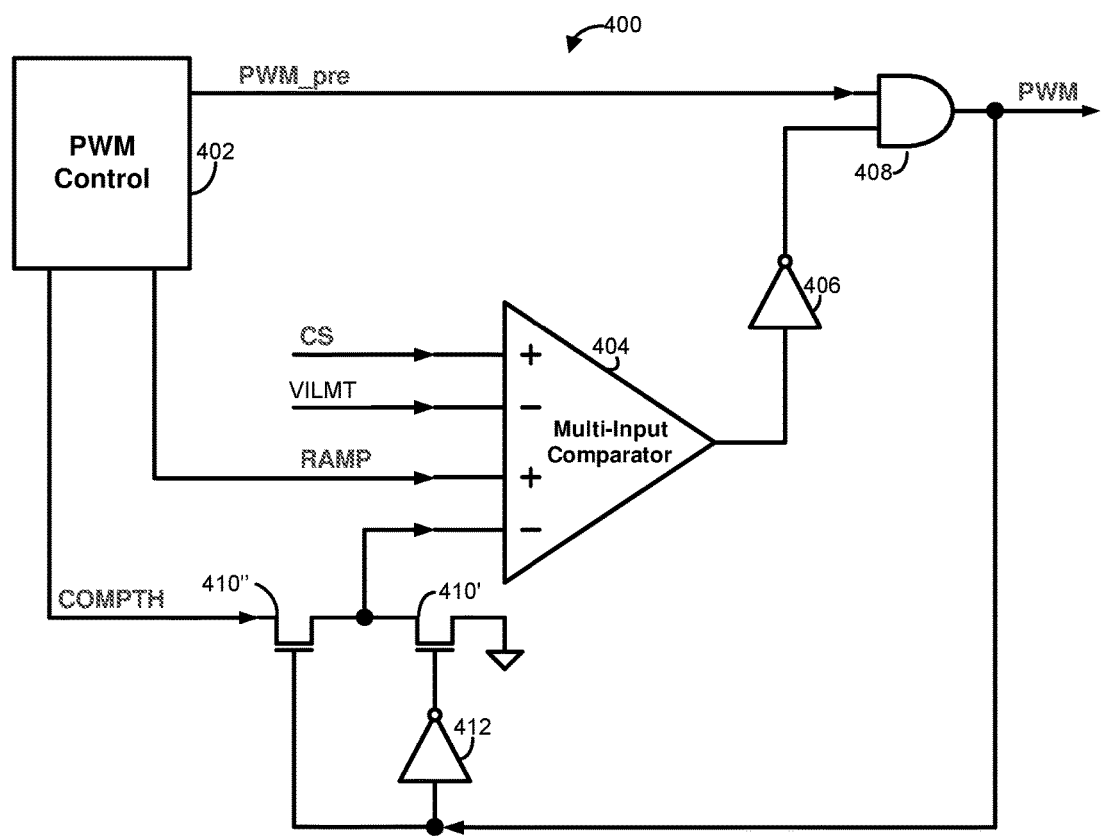
FIG. 4 illustrates another example embodiment of an over-current protection circuit according to one embodiment of the present disclosure.

FIG. 4 illustrates another embodiment of an over-current protection circuit 400 that may be used to provide over-current protection during off times of the PWM signal as well as during on times of the PWM signal according to one embodiment of the present disclosure. The over-current protection circuit 400 includes a PWM control circuit 402, a multi-input comparator 404, a first inverter 406, an AND gate 408, two switches 410, and a second inverter 412.

In one embodiment, the PWM control circuit 402 may be embodied as a monolithic chip that provides a PWM_pre signal, a RAMP signal, and a COMPTH signal using its internal circuitry. So that overall parts count required for over-current protection according to the teachings of the present disclosure may be reduced. In general, the RAMP signal and the COMPTH signals of FIG. 4 are similar in functionality to the RAMP signal, and the VTH signal as shown and described with respect to FIG. 1. The over-current protection circuit 400 may also incorporate other signals similar to those described above with reference to FIG. 1. For example, the over-current protection circuit 400 may use a CS signal that is similar in functionality to the CS signal of FIG. 1, while the $V_{ILMT}$ signal is similar in functionality to the $V_{ILMT}$ signal of FIG. 1.

The over-current protection circuit 400 may provide over-current protection during off times of the PWM signal using the CS signal and $V_{ILMT}$ signal to the multi-input comparator 404 as described above with reference to FIG. 1. Additionally, the over-current protection circuit 400 may provide over-current protection during on times of the PWM signal using the RAMP signal and the COMPTH signal to the multi-input comparator 404. For off time over-current protection, when the CS signal exceeds the level of the $V_{ILMT}$ signal, the output of the multi-input comparator 404 stays at a logic high level such that the AND gate 408 blocks, via the inverter 406, the PWM_pre signal from being propagated to a PWM signal for controlling a switching voltage regulator. During these off times of the PWM signal, the COMPTH signal is disconnected from the input of the multi-input comparator 404 by a first switch 410", while the input of the multi-input comparator 404 is connected to ground or the RAMP signal using a second switch 410' and the inverter 412. In the meanwhile, the RAMP signal may stay in the ground level.

For on time over-current protection with COMPTH connected to the multi-input comparator 404 via the first switch 410", when a summed level of the CS signal and the RAMP signal exceeds a summed level of the VILMT signal and the COMPTH signal, the output of the multi-input comparator 404 goes to a logic high level such that the AND gate 408 blocks, via the inverter 406, the PWM_pre signal from being propagated to the PWM signal.

Embodiments of the over-current protection circuit 400 may have a particular advantage over the current protection circuit 100 of FIG. 1, that is the usage of the RAMP signal and COMPTH signals provided by the PWM control circuit 402 for reduced component count.

Figure 5:
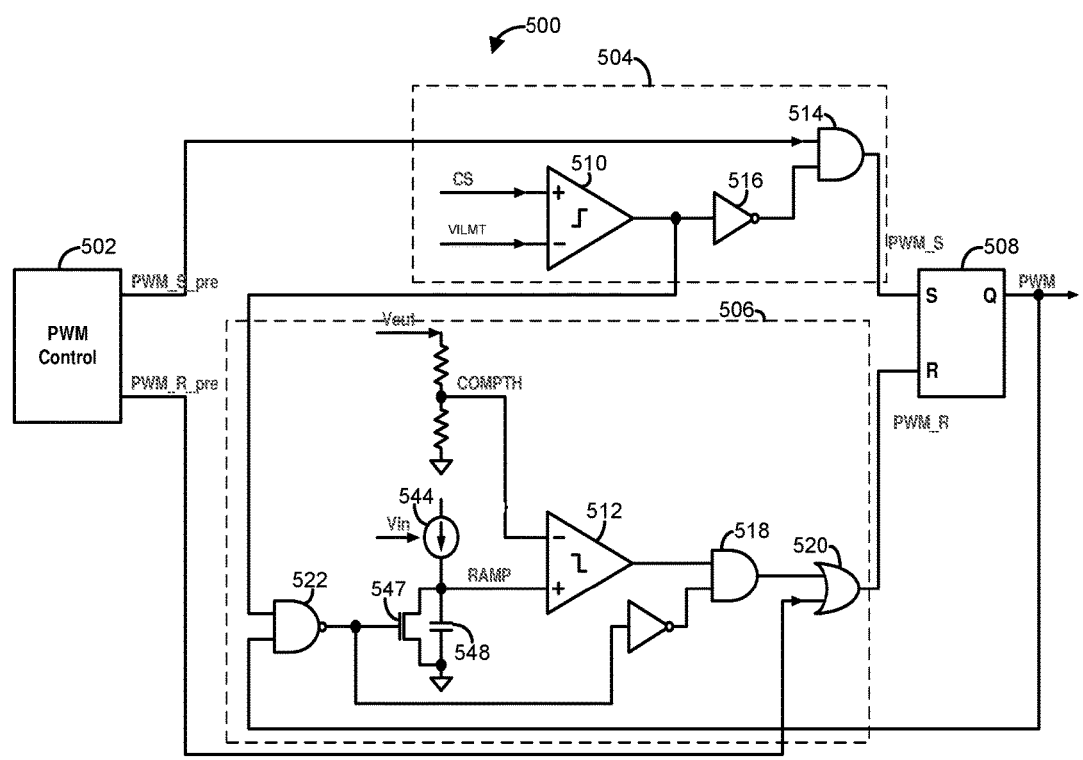
FIG. 5 illustrates another example embodiment of an over-current protection circuit according to one embodiment of the present disclosure.

FIG. 5 illustrates another example embodiment of an over-current protection circuit 500 that may be used to provide over-current protection during off times of the PWM signal as well as during on times of the PWM signal according to one embodiment of the present disclosure. The over-current protection circuit 500 as shown may be particularly useful when a continuous current sensing is used; that is, when over-current conditions are sensed across an inductor or a sensing resistor in series with the inductor, rather than at a low-side switch of the push-pull switch circuit as shown and described above with reference to FIG. 1.

The over-current protection circuit 500 generally includes a PWM control circuit 502, an off time over-current protection circuit 504, an on time over-current protection circuit 506, and a PWM latch 508. The PWM control circuit 502 may include any type of circuitry (e.g., a monolithic circuit chip) that generates a PWM_S_pre signal and a PWM_R_pre signal that are fed to the PWM latch 508. The off time current limit circuit 504 selectively gates the PWM_S_pre signal to the PWM latch 508, and the on time current limit circuit 506 selectively gates the PWM_R_pre signal to the PWM latch 508.

The off time current limit circuit 504 may provide over-current protection during off times of the PWM signal using the CS signal and $V_{ILMT}$ signal to a first comparator 510 in which the CS signal and $V_{ILMT}$ signal functions in a manner similar to that described above with reference to FIG. 1. When the CS signal exceeds the level of the $V_{ILMT}$ signal, the output of the first comparator 510 may go to a logic high level such that an AND gate 514 blocks, via an inverter 516, the PWM_S_pre signal from being propagated to a PWM signal for controlling a switching voltage regulator. During these off times of the PWM signal, the RAMP signal is pulled low by a switch 547 controlled by a NAND gate 522, and the output of a second comparator 512 is blocked by an AND gate 518 from being propagating to the reset signal PWM_R to the PWM latch 508.

For on time over-current protection, a capacitor 548 starts to be charged by an adaptive current source 544 once the CS signal goes higher than the $V_{ILMT}$ level during an on time of the PWM signal. When the RAMP signal exceeds the level of the COMPTH signal, the output of the second comparator 512 may go to a logic high level such that an OR gate 520 resets the PWM signal for controlling the switching voltage regulator.

Although the over-current protection circuits 100, 300, 400, and 500 illustrate example embodiments of circuits that may be used to provide over-current protection for voltage regulators, other embodiments may have other topologies without departing from the spirit and scope of the present disclosure. For example, other embodiments may include additional components, fewer components, or different components than what is described herein. Additionally, certain components of each of the example circuits 100, 300, 400, and 500 may be integrated into a monolithic circuit chip, while other components are implemented using discrete circuitry.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. An electrical circuit comprising:
   a control circuit to generate a PWM signal with a duty cycle proportional to an output voltage of a voltage regulator;
   a switch circuit selectively coupling an input of the regulator to an output of the regulator using the PWM signal;
   a first over-current protection circuit comprising:
      a first comparator having an output, a first input coupled to a low-side current-sense point of the switch circuit, and a second input coupled to a first reference voltage; and
      a first gate having an output coupled to the switch circuit, a first input coupled to the control circuit, and a second input coupled to the output of the first comparator; and
   a second over-current protection circuit comprising:
      a first summing circuit having an output, a first input coupled to the low-side current-sense point of the switch circuit, and a second input coupled to a ramp generator;
      a second summing circuit having an output, a first input coupled to the first reference voltage, and a second input coupled to a threshold generator;
      a second comparator having an output, a first input coupled to the output of the first summing circuit, and a second input coupled to the output of the second summing circuit; and
      a second gate having an output coupled to the switch circuit, a first input coupled to the control circuit, and a second input coupled to the output of the second comparator.

2. The electrical circuit of claim 1, wherein the switch circuit comprises a push-pull switch circuit that includes a high-side metal-oxide-semiconductor field-effect transistor (MOSFET) switch and a low-side MOSFET switch.

3. The electrical circuit of claim 1, comprising a sample-and-hold circuit to store the low-side switch current-sense level during an on time of the PWM signal.

4. The electrical circuit of claim 1, further comprising a circuit sensing the low-side switch current-sense level of the switch circuit using a continuous current-sense point of the voltage regulator.

5. The electrical circuit of claim 1, wherein the ramp generator generates a ramp signal having a slew rate that is proportional to the input voltage of the voltage regulator and a switching frequency of the PWM signal.

6. The electrical circuit of claim 5, wherein the slew rate of the ramp signal is set such that the switching frequency during over-current protection is essentially similar to the switching frequency during normal operation.

7. The electrical circuit of claim 1, wherein the threshold generator is coupled to at least one of the output of the voltage regulator and a second reference voltage.

8. The electrical circuit of claim 1, further comprising a gating circuit to disable operation of the second over-current protection circuit during the off times of the PWM signal.

9. An over-current protection method for an electrical circuit, the method comprising:
   blocking a PWM signal to a switch circuit when an over-current condition exists during an off time of the PWM signal when a low-side switch current-sense level obtained from a low-side sense point of the switch circuit exceeds a first reference voltage; and
   tuning off the PWM signal to the switch circuit when an over-current condition exists during an on time of the PWM signal when a ramp adjusted voltage level comprising a ramp signal summed with the low-side switch current-sense level exceeds a summed level of the first reference voltage and a threshold voltage.

10. The method of claim 9, further comprising sensing the low-side switch current-sense level of a push-pull switch circuit including an high-side metal-oxide-semiconductor field-effect transistor (MOSFET) switch and a low-side MOSFET switch, the low-side current-sense point comprising a drain terminal of the low-side MOSFET switch.

11. The method of claim 9, further comprising sensing the low-side switch current-sense level of the switch circuit using a continuous current sense point of the voltage regulator.

12. The method of claim 9, further comprising storing the low-side switch current-sense level during an on time of the PWM signal.

13. The method of claim 9, further comprising setting the ramp signal to have a slew rate that is proportional to an input voltage of the voltage regulator and a switching frequency of the PWM signal.

14. The method of claim 13, further comprising setting the slew rate such that the switching frequency during over-current protection is essentially similar to the switching frequency during normal operation.

15. The method of claim 9, further comprising setting the threshold voltage that is proportional to an output voltage level or a second reference voltage.

16. The method of claim 9, further comprising disabling operation of the second over-current protection circuit during the off times of the PWM signal.

17. An electrical circuit comprising:
   a control circuit to generate a PWM signal with a duty cycle proportional to an output voltage of the voltage regulator;
   a push-pull switch circuit selectively coupling an input of the switch circuit to an output of the switch circuit using the PWM signal, the push-pull switch circuit including a high-side metal-oxide-semiconductor field-effect transistor (MOSFET) switch and a low-side MOSFET switch;
   a first over-current protection circuit comprising:
      a first comparator having an output, a first input coupled to a low-side switch current-sense point of the push-pull switch circuit, and a second input coupled to a first reference voltage; and
      a first gate having an output coupled to the switch circuit, a first input coupled to the control circuit, and a second input coupled to the output of the first comparator; and
   a second over-current protection circuit comprising:
      a sample-and-hold circuit coupled to the low-side switch current-sense point, the sample-and-hold circuit to store the low-side current-sense voltage level during an on time of the PWM signal;
      a first summing circuit having an output, a first input coupled to the sample-and-hold circuit, and a second input coupled to a ramp generator;
      a second summing circuit having an output, a first input coupled to the first reference voltage, and a second input coupled to a threshold generator;
      a second comparator having an output, a first input coupled to the output of the first summing circuit, and a second input coupled to the output of the second summing circuit; and a second gate having an output coupled to the switch circuit, a first input coupled to the control circuit, and a second input coupled to the output of the second comparator.

18. The electrical circuit of claim 17, wherein the ramp generator generates a ramp signal having a slew rate that is proportional to the input voltage of the voltage regulator and a switching frequency of the PWM signal.

19. The electrical circuit of claim 18, wherein the slew rate is set such that the switching frequency during over-current protection is essentially similar to the switching frequency during normal operation.

* * * * *